United States Patent [19]

Highton

[11] Patent Number: 4,578,820
[45] Date of Patent: Mar. 25, 1986

[54] RECEIVED SIGNAL STRENGTH INDICATOR

[75] Inventor: Frederick J. Highton, Lynchburg, Va.

[73] Assignee: General Electric Company, Schenectady, N.Y.

[21] Appl. No.: 586,546

[22] Filed: Mar. 5, 1984

[51] Int. Cl.[4] .................. H04B 11/16; H03F 3/04
[52] U.S. Cl. .................. 455/154; 330/288; 330/289; 330/257; 455/226
[58] Field of Search .......... 330/2, 256, 257, 288, 330/289; 455/154, 226

[56] References Cited

U.S. PATENT DOCUMENTS

| 4,045,746 | 8/1977 | Wheatley, Jr. | 455/154 |
| 4,109,206 | 8/1978 | Numata | 455/226 |
| 4,122,394 | 10/1978 | Fukushima et al. | 329/103 |
| 4,238,738 | 12/1980 | Komori | 330/256 |
| 4,243,948 | 1/1981 | Schade, Jr. | 330/289 |
| 4,247,949 | 1/1981 | Watanabe et al. | 455/154 |
| 4,251,778 | 2/1981 | Ahmed | 330/279 |
| 4,274,061 | 6/1981 | Kraemer | 330/296 |
| 4,433,302 | 2/1984 | Davies et al. | 330/257 |

Primary Examiner—James B. Mullins
Attorney, Agent, or Firm—James J. Williams; Robert C. Lampe, Jr.

[57] ABSTRACT

Temperature compensation for received signal strength indications (RSSI) is provided by a reference circuit having the same temperature characteristic as the RSSI circuit, and by a difference circuit. The RSSI signal and the reference signal are applied to the difference circuit which provides a temperature compensated RSSI output in which temperature variations have been removed by the reference signal.

7 Claims, 4 Drawing Figures

RECEIVED SIGNAL STRENGTH INDICATOR

BACKGROUND OF THE INVENTION

My invention relates to a received signal strength indicator for a radio receiver, and particularly to such an indicator that is temperature compensated.

In radio receivers, particularly frequency modulation (FM) receivers, it is often convenient or desirable to have a received signal strength indication (RSSI). A received signal strength indicator provides a very effective method of tuning a radio receiver, and it can be utilized as part of a carrier squelch circuit. A received signal strength indicator is mandatory or a very necessary part of radio telephone cellular systems which monitor the strengths of received signals, and allocate specific channels for utilization on the basis of those signal strengths.

In FIG. 1, I show a block diagram of a prior art radio receiver having a received signal strength indicator. Such a receiver includes an antenna 10 which supplies radio signals to one or more stages of RF amplifiers 11. The amplified radio signals are applied to a mixer 12 along with a suitable signal from an oscillator 13 to produce an intermediate frequency (IF) signal. This IF signal is filtered in a filter 14. The filtered IF signal is then amplified by one or more stages of IF amplifiers. As an example, I have assumed that the receiver utilizes two intermediate frequency (IF) amplifiers 15, 16 coupled in cascade. More or less intermediate frequency amplifiers may be provided. The signal output from the second IF amplifier 16 is applied to a discriminator 17. The output of the discriminator 17 may be suitably amplified and applied to an output device such as a loudspeaker. In FIG. 1, I have shown each of the IF amplifiers 15, 16 producing a received signal strength indication (RSSI). However, persons skilled in the art will appreciate that received signal strength indications may also be derived from the RF amplifier 11, if suitable filtering is provided.

FIG. 2 shows a schematic diagram of one of the IF amplifiers 15, 16 of FIG. 1, which typically are similar or identical. Such an amplifier includes a suitable source of direct current voltage B+ supplied to a bus 20 with respect to a ground or reference potential 21. The signal input from either the filter 14 or a preceding IF amplifier is applied to terminals 22, 23 which are respectively coupled to the base electrodes of similar NPN transistors Q1, Q2. The collectors of these transistors are coupled to the voltage bus 20 through respective similar resistors R4, R5. The emitters are coupled to a common junction 24 which in turn is coupled through a current source 25 to the ground 21. The base electrodes of the transistors Q1, Q2 are respectively coupled through similar resistors R1, R2 to the base electrode of an NPN transistor Q3. The emitter of the transistor Q3 is coupled through a resistor R3 to the junction 24, and the collector of the transistor Q3 provides the received signal strength indication (RSSI). This RSSI is coupled to a suitable voltage as will be explained. The amplified signal output is derived from the collectors of the transistors Q1, Q2, and may either be applied to another intermediate frequency amplifier or to the discriminator 17.

The circuit of FIG. 2 is known in the art. When a relatively large signal is applied to the input terminals 22, 23, the signal at the junction 24 is a full wave rectified signal. The transistor Q3 has its base electrode biased midway between the input signals at the terminals 22, 23, and hence remains at a constant potential regardless of signal level. Under small signal input conditions, the collector current of the transistor Q3 is determined by the magnitude of the resistor R3 and the direct current voltage at the junction 24. When the input signal level increases, the full wave rectified signal of the transistors Q1, Q2 tends to raise the emitter voltage of the transistor Q3, and reduce its collector current. Thus, the RSSI current to the collector of the transistor Q3 decreases as the input signal level increases, and conversely increases as the input signal level decreases. If the individual RSSI output currents (from each circuit like FIG. 2) are summed and filtered, a quasi logarithmic curve of RSSI output current in microamperes ($\mu A$) versus signal input level in dbm is provided, as shown in FIG. 3.

It is known in the art that typical NPN type transistors such as transistors Q1, Q2 and Q3 are temperature sensitive. It can be shown for the circuit of FIG. 2 that as the ambient temperature increases, the RSSI current increases, and conversely as the ambient temperature decreases, the RSSI current decreases. Such sensitivity to changes in ambient temperature reduces the accuracy and performance of a radio receiver relying on RSSI such as shown in FIG. 1, so that temperature compensation is highly desirable, if not essential.

SUMMARY OF THE INVENTION

Briefly, in accordance with my invention, I provide a first circuit coupled to each of the received signal strength indication outputs to produce a first signal proportional to the sum of all of the received signal strength indications. Since the individual received signal strength indications vary as a function of ambient temperature, this first signal also varies as a function of the ambient temperature. I further provide a reference circuit that produces a reference signal of predetermined magnitude. This reference circuit produces a reference signal that also varies as a function of the ambient temperature in the same manner as the temperature variation of the first signal proportional to the sum of the received signal strength indications. A difference circuit is coupled to the first circuit and to the reference circuit to provide an output signal in which variations in the first signal resulting from ambient temperature have been removed to provide a temperature compensated output signal proportional only to the received signal strength indications. Thus, a more accurate and useful received signal strength indication is provided. In a preferred embodiment, the first circuit, the reference circuit, and the difference circuit preferably comprise current mirrors.

BRIEF DESCRIPTION OF THE DRAWING

The subject matter which I regard as my invention is particularly pointed out and distinctly claimed in the claims. The structure and operation of my invention, as well as advantages, may be better understood from the following description given in connection with the accompanying drawing, in which:

DESCRIPTION OF THE PREFERRED EMBODIMENT

Figure 1:
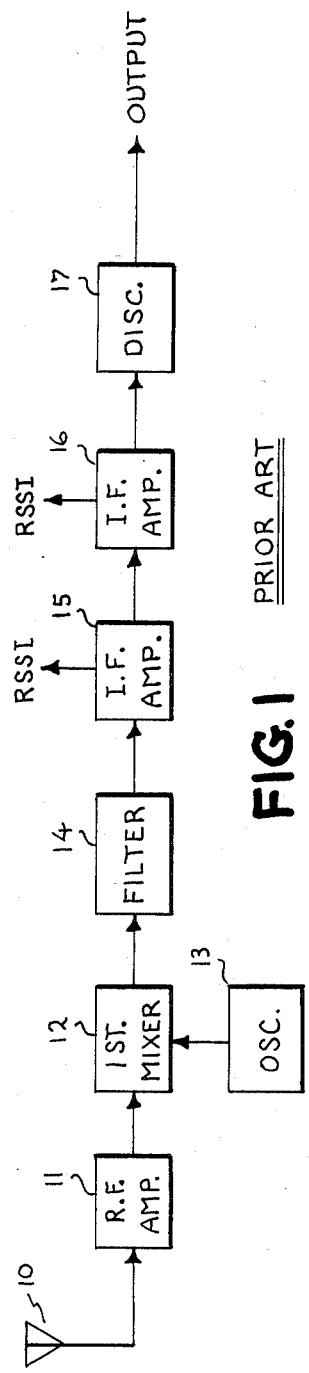
FIG. 1 shows a block diagram of a radio receiver having a received signal strength indicator for which my temperature compensation circuit is intended.
Figure 2:
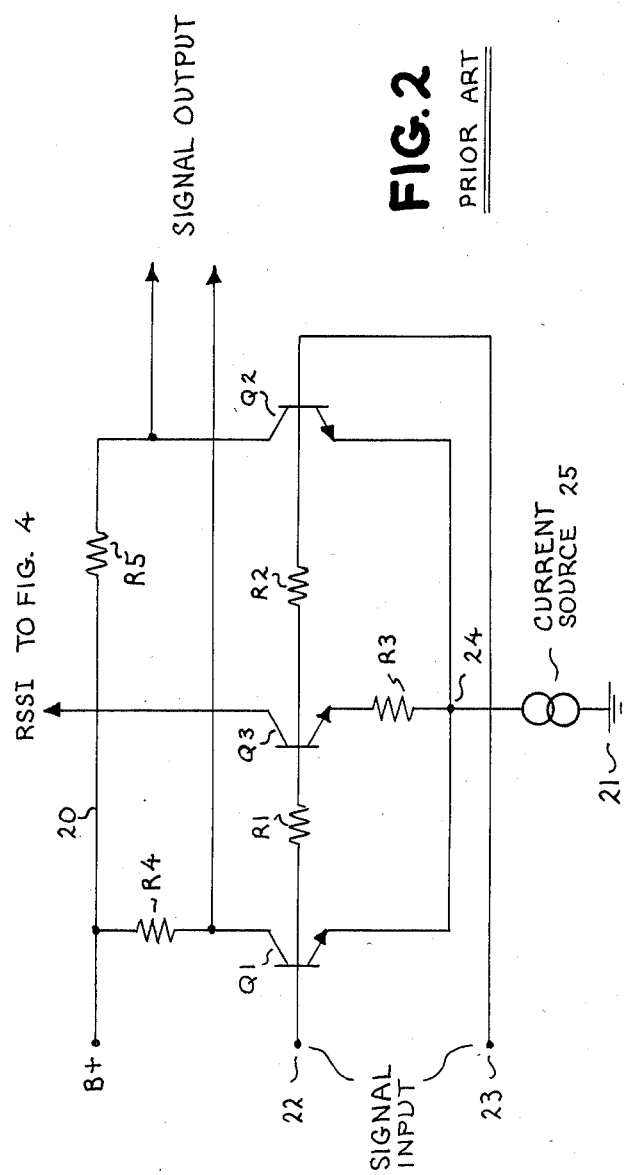
FIG. 2 shows a schematic diagram of a typical or prior art received signal strength indicator circuit for which my invention is intended.
Figure 3:
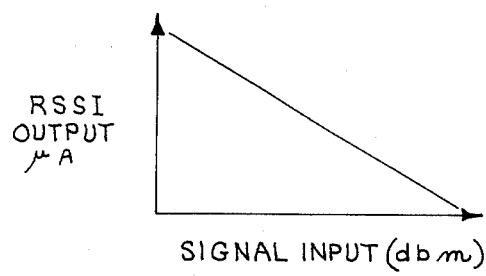
FIG. 3 shows the received signal strength indicator output of the circuit of FIG. 2 as a function of signal input.
Figure 4:
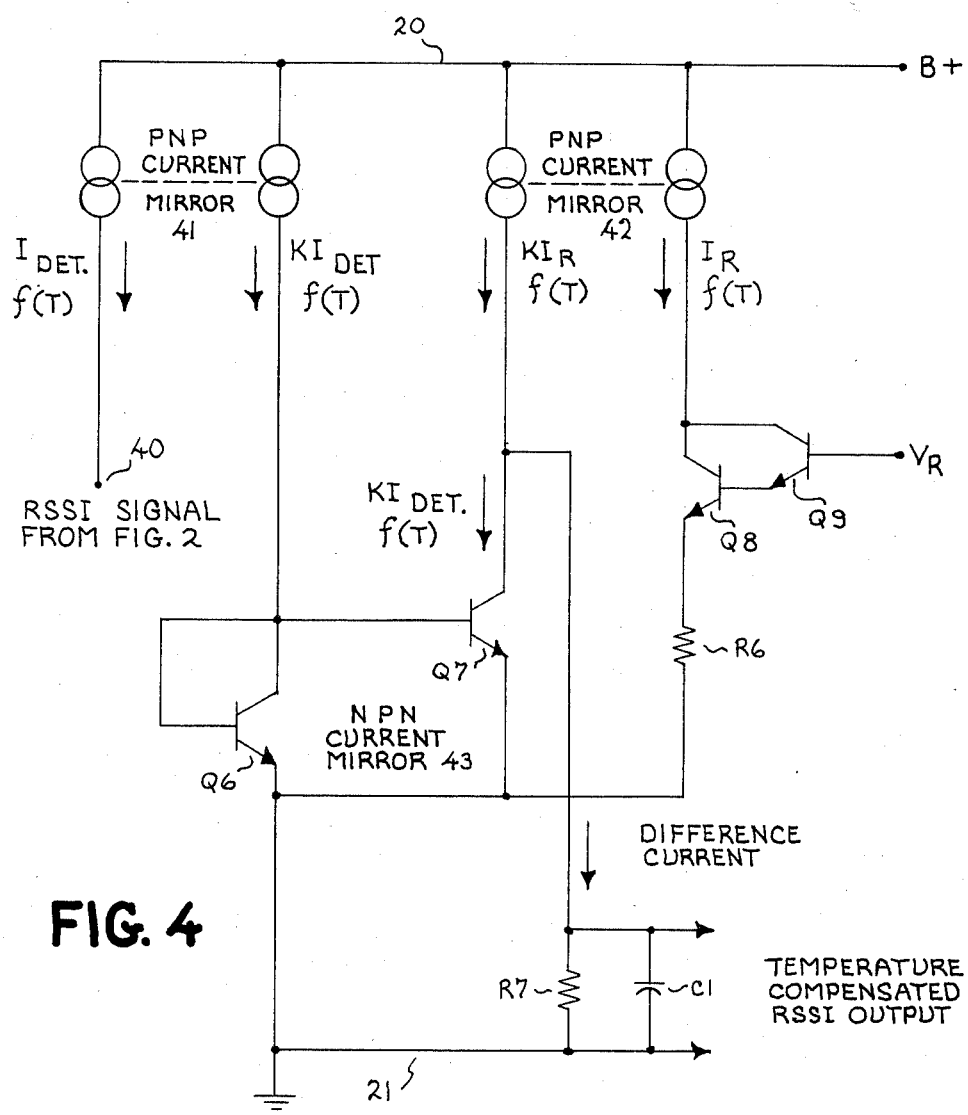
FIG. 4 shows a schematic diagram of my improved temperature compensation circuit for a received signal strength indicator circuit such as shown in FIG. 2.

My compensating circuit of FIG. 4 is provided with a suitable source of direct current voltage B+ supplied to the bus 20 with respect to the ground or reference potential 21. Received signal strength indication signals from circuits such as shown in FIG. 2 are applied to an input terminal 40. These signals are in the form of a current which flows from the bus 20 through one side of a PNP current mirror 41, and through the transistor Q3, the resistor R3, and the current source 25 to the ground 21 of FIG. 2. This current is indicated as the detector current $I_{DET}$ which varies as a function (f) of temperature (T). The other side of the current mirror 41 provides a corresponding current signal amplified or increased by a factor K as indicated.

Also in accordance with my invention, I provide a reference signal or voltage $V_R$ which is applied to an NPN transistor Q9 coupled as shown to a second NPN transistor Q8. I use two transistors in order to provide sufficient temperature sensitivity. These transistors Q8, Q9 are preferably located in the same area as and have the same temperature characteristics as the transistors Q1, Q2, Q3 of FIG. 2 so that their characteristics vary in the same manner with temperature. This reference circuit is supplied with a current from one side of a PNP current mirror 42 connected to the bus 20. A reference current $I_R$ that varies as a function of temperature flows from the bus 20 through the transistors Q8, Q9, and through a resistor R6 to the ground 21. This reference current $I_R$ varies as a function (f) of temperature (T) preferably by the same amount as the variation of the detector current $I_{DET}$. The other portion of the current mirror 42 provides the same reference current that varies as a function (f) of temperature (T) but that is amplified or increased by a factor K.

As described thus far, it will be seen that I provide two currents, a detector current $KI_{DET}$ and a reference current $KI_R$. The reference current $KI_R$ should provide the same variation with temperature as the detector current $KI_{DET}$. These two currents are applied to an NPN current mirror 43 which produces a difference current. Specifically, the detector current $KI_{DET}$ is applied to a transistor Q6 connected to form a diode, and the reference current $KI_R$ is applied to the NPN transistor Q7 connected as shown to provide a difference current. The difference current is derived from the collector of the transistor Q7 and applied to a suitable RC filter comprised of a transistor R7 and a capacitor C1. By proper design and selection of values, the circuit of FIG. 4 produces a difference current which is proportional to the received signal strength indication, but which has any variations of temperature in this receive signal strength indicator current removed by the reference current. Thus, the difference current provides an accurate indication of the received signal strength, and is compensated so that this indication is substantially independent of ambient temperature variations.

My temperature compensating circuit provides an improved received signal strength indication, and can be used with radio receivers of other types of modulation besides FM. The embodiment shown in FIG. 4 lends itself readily to large scale integrated circuits. However, persons skilled in the art will appreciate that modifications may be made. For example, the current mirror 41 and the current mirror 42 may be replaced by suitable voltage circuits whose respective outputs are applied to a differential amplifier which produces an output that compensates for temperature variations in the receive signal strength indication. However, such an arrangement is not as readily built in large scale integrated circuit form. Hence, persons skilled in the art will appreciate that the particular circuit arrangement utilized depends upon the particular configuration that the circuit must take. Therefore, while my invention has been described with reference to a particular embodiment, it is to be understood that modifications may be made without departing from the spirit of the invention or from the scope of the claims.

What I claim as new and desire to secure by Letters Patent of the United States is:

1. An improved signal strength indicator for a radio receiver comprising:
   a. a temperature sensitive input circuit coupled to said receiver for producing a first signal that has a magnitude indicative of the signal strength received by said receiver;
   b. a first current mirror circuit coupled to said input circuit for producing a first mirror current whose magnitude is proportional to said first signal;
   c. a temperature sensitive reference circuit for producing a reference signal;
   d. a second current mirror circuit coupled to said reference circuit for producing a second mirror current whose magnitude is proportional to said reference signal;
   e. and a third current mirror circuit comprising a pair of transistors wherein said transistors have common bases, one transistor has a collector coupled to said bases and said first current mirror circuit, and said other transistor has a collector coupled to said second mirror circuit, for producing an output signal derived from the collector of said other transistor and having a magnitude proportional to the difference between said first mirror current and said second mirror current.

2. The improved signal strength indicator of claim 1 wherein said first mirror current and said second mirror current have temperature sensitive components that are substantially the same so that said output signal is substantially independent of temperature.

3. An improved signal strength indicator for a radio receiver having a radio frequency signal input, an amplifier coupled to said signal input, and a demodulator coupled to said amplifier, said signal strength indicator comprising:
   a. first means coupled to said amplifier for deriving a first signal indicative of the strength of radio frequency signals at said receiver signal input, said first means comprising solid state devices that have an ambient temperature sensitivity;
   b. a first current mirror circuit coupled to said first means for producing a first current signal having a magnitude proportional to said first signal;
   c. second means for producing a reference signal, said second means comprising solid state devices that have an ambient temperature sensitivity similar to said ambient temperature sensitivity of said solid state devices of said first means;

d. a second current mirror circuit coupled to said second means for producing a second current signal having a magnitude proportional to said reference signal;

e. and a third current mirror circuit comprising a pair of transistors wherein said transistors have common bases, one transistor has a collector coupled to said bases and said first current mirror circuit, and said other transistor has a collector coupled to said second mirror circuit, for deriving an output signal from the collector of said other transistor that is proportional to the difference between said first current signal magnitude and said second current signal magnitude to provide a signal strength indication that is relatively insensitive to ambient temperature variations.

4. The improved signal strength indicator of claim 3 wherein said solid state devices of said first means and said second means comprise transistors with substantially similar base-to-output electrode voltage-temperature characteristics.

5. The improved signal strength indicator of claim 4 wherein said radio receiver amplifier comprises a plurality of cascaded intermediate frequency amplifier stages.

6. The improved signal strength indicator of claim 3 wherein said radio receiver amplifier comprises a plurality of cascaded intermediate frequency amplifier stages.

7. An improved signal strength indicator for a radio receiver having a radio frequency signal input, an amplifier coupled to said signal input, and a demodulator coupled to said amplifier, said signal strength indicator comprising:

a. first means coupled to said amplifier for deriving a first signal indicative of the strength of radio frequency signals at said receiver signal input, said first means comprising solid state devices that have an ambient temperature sensitivity;

b. second means for producing a reference signal, said second means comprising solid state devices that have an ambient temperature sensitivity similar to said ambient temperature sensitivity of said solid state devices of said first means;

c. and a current mirror circuit comprising a pair of transistors wherein said transistors have common bases, one transistor has a collector coupled to said bases and said first means, and said other transistor has a collector coupled to said second means, for deriving on output signal from the collector of the other transistor that is proportional to said first signal modified by said reference signal to provide a signal strength indication that is relatively insensitive to ambient temperature variations.

* * * * *